(12) United States Patent
Dosanjh et al.

(10) Patent No.: US 7,277,683 B2
(45) Date of Patent: Oct. 2, 2007

(54) REGENERATIVE DIVIDER FOR UP AND DOWN CONVERSION OF RADIO FREQUENCY (RF) SIGNALS

(75) Inventors: Sathwant Dosanjh, Brampton (CA); William Kung, Waterloo (CA); Tajinder Manku, Waterloo (CA)

(73) Assignee: Sirific Wireless Corporation, Waterloo, Ontario (CA)

( * ) Notice: Subject to any disclaimer, the term of this patent is extended or adjusted under 35 U.S.C. 154(b) by 0 days.

(21) Appl. No.: 10/541,120

(22) PCT Filed: Jan. 8, 2004

(86) PCT No.: PCT/CA2004/000025

§ 371 (c)(1),
(2), (4) Date: Mar. 1, 2006

(87) PCT Pub. No.: WO2004/064246

PCT Pub. Date: Jul. 29, 2004

(65) Prior Publication Data

US 2006/0246861 A1 Nov. 2, 2006

Related U.S. Application Data

(60) Provisional application No. 60/438,711, filed on Jan. 8, 2003.

(30) Foreign Application Priority Data

Jan. 8, 2003 (CA) .................................... 2415917

(51) Int. Cl.
*H04B 1/16* (2006.01)
(52) U.S. Cl. ...................... 455/209; 455/208; 455/147; 455/315; 455/318; 331/40; 331/43; 331/77; 331/22; 331/30
(58) Field of Classification Search ................ 455/208, 455/209, 147, 315, 318; 331/40, 43, 77, 331/22, 30
See application file for complete search history.

(56) References Cited

U.S. PATENT DOCUMENTS 5,881,100 A  *  3/1999 Durrant et al. ............. 375/150

(Continued)

FOREIGN PATENT DOCUMENTS

WO 0214889 2/2002

OTHER PUBLICATIONS

Groslambert et al. "High Spectral Purity Frequency Sources Using Low Noise Regenerative Frequency Dividers", Proceedings of the 45th Annual Symposium on Frequency Control, pp. 636-639 1991.
Grant. "Solving the Direct Conversion Problem", Planet Analog. Retrieved from the Internet: <URL:http://www.planetanalog.com/printableArticle.jhtml?articleID=12801318> 2000.

*Primary Examiner*—Edan Orgad
*Assistant Examiner*—Junpeng Chen
(74) *Attorney, Agent, or Firm*—Shin Hung; Borden Ladner Gervais LLP

(57) ABSTRACT

The present invention relates generally to communications, and more specifically to a method and apparatus for generating local oscillator signals used for up- and down-conversion of RF (radio frequency) signals. A major problem in the design of modulators and demodulators, if the leakage of local oscillator (LO) signals into the received signal path. The invention presents a number of highly integratable circuits which resolve the LO leakage problem, using regenerative divider circuits acting on oscillator signals which are running at a multiple or fraction of the frequency of the desired LO signal, to generate in-phase (I) and quadrature (Q) mixing signals. Embodiments of these circuits also use harmonic subtraction and polyphase mixers, as well as virtual local oscillator TM (VLO) mixing signals. VLO mixing signals are signal pairs which emulate local oscillator signals by means of complementary mono-tonal and multi-tonal mixing signals.

10 Claims, 14 Drawing Sheets

U.S. PATENT DOCUMENTS

| | | | |
|---|---|---|---|
| 5,953,370 A * | 9/1999 | Durrant et al. | 375/150 |
| 6,148,181 A * | 11/2000 | Otaka | 455/86 |
| 6,574,462 B1 * | 6/2003 | Strange | 455/318 |
| 6,731,923 B2 * | 5/2004 | Atkinson | 455/323 |
| 6,788,157 B2 * | 9/2004 | Clarke | 331/74 |
| 6,960,962 B2 * | 11/2005 | Peterzell et al. | 331/40 |
| 7,027,833 B1 * | 4/2006 | Goodman | 455/553.1 |
| 7,046,980 B1 * | 5/2006 | Manku et al. | 455/323 |
| 7,058,380 B2 * | 6/2006 | Sato | 455/260 |
| 7,106,805 B2 * | 9/2006 | Atkinson et al. | 375/295 |
| 2001/0039182 A1 * | 11/2001 | Atkinson | 455/20 |
| 2002/0022465 A1 * | 2/2002 | McCullagh et al. | 455/260 |
| 2004/0080373 A1 * | 4/2004 | Clarke | 331/25 |
| 2005/0180528 A1 * | 8/2005 | Manku | 375/316 |
| 2006/0141952 A1 * | 6/2006 | Kung et al. | 455/102 |

* cited by examiner

REGENERATIVE DIVIDER FOR UP AND DOWN CONVERSION OF RADIO FREQUENCY (RF) SIGNALS

The present invention relates generally to communications, and more specifically to a method and apparatus for generating local oscillator signals used for up- and down-conversion of RF (radio frequency) signals.

BACKGROUND OF THE INVENTION

Many communication systems modulate electromagnetic signals from baseband to higher frequencies for transmission, and subsequently demodulate those high frequencies back to their original frequency band when they reach the receiver. The original (or baseband) signal may be, for example: data, voice or video. These baseband signals may be produced by transducers such as microphones or video cameras, be computer generated, or be transferred from an electronic storage device. In general, the high frequencies provide longer range and higher capacity channels than baseband signals, and because high frequency signals can effectively propagate through the air, they can be used for wireless transmissions as well as hard wired or wave guided channels.

All of these signals are generally referred to as RF signals, which are electromagnetic signals; that is, waveforms with electrical and magnetic properties within the electromagnetic spectrum normally associated with radio wave propagation.

Wired communication systems which employ such modulation and demodulation techniques include computer communication systems such as local area networks (LANs), point-to-point communications, and wide area networks (WANs) such as the Internet. These networks generally communicate data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

Most RF receivers use the "super-heterodyne" topology, which provides good performance in a limited scope of applications, such as in public-broadcast FM radio receivers. The super-heterodyne receiver uses a two-step frequency translation method to convert a received RF signal to a baseband signal which can be played using an audio amplifier and speaker, for example. FIG. 1 presents a block diagram of a typical super-heterodyne receiver 10. The mixers 12 and 14 are used to translate the RF signal to baseband or to some intermediate frequency (IF). The balance of the components amplify the signal being processed and filter noise from it.

The RF band pass filter 18 first filters the signal coming from the antenna 20 (note that this band pass filter 18 may also be a duplexer). A low noise amplifier 22 then amplifies the filtered antenna signal, increasing the strength of the RF signal and reducing the noise figure of the receiver 10. The signal is next filtered by another band pass filter 24 usually identified as an image rejection filter. The signal then enters mixer 12 which multiplies the signal from the image rejection filter 24 with a periodic signal generated by a local oscillator (LO1) 26. The mixer 12 receives the signal from the image rejection filter 24 and translates it to a lower frequency, known as the first intermediate frequency.

Generally, a mixer is a circuit or device that accepts as its input two different frequencies and presents at its output:
 (a) a signal equal in frequency to the sum of the frequencies of the input signals;
 (b) a signal equal in frequency to the difference between the frequencies of the input signals; and
 (c) signals at the original input frequencies.

The typical embodiment of a mixer is a digital switch which may generate significantly more tones than those stated above.

The first intermediate frequency signal is next filtered by a band pass filter 28 typically called the channel filter, which is centred around the first intermediate frequency, thus filtering out the unwanted products of the first mixing processes; signals (a) and (c) above. This is necessary to prevent these signals from interfering with the desired signal when the second mixing process is performed.

The signal is then amplified by an intermediate frequency amplifier 30, and is mixed with a second local oscillator signal using mixer 14 and local oscillator (LO2) 32. The second local oscillator LO2 32 generates a periodic signal which is typically tuned to the first intermediate frequency. Thus, the signal coming from the output of mixer 14 is now at baseband, that is, the frequency at which the signal was originally generated. Noise is now filtered from the signal using the low pass filter 34, and the filtered baseband signal is passed on to some manner of presentation, processing or recording device. For example, in the case of a radio receiver, this might be an audio amplifier and speaker, while in the case of a computer modem this may be an analogue to digital convertor.

Note that the same process can be used to modulate or demodulate any electrical signal from one frequency to another.

The super-heterodyne design 10 suffers from a number of problems including the following:
 it requires expensive off-chip components, particularly band pass filters 18, 24, 28, and low pass filter 34;
 the off-chip components require design trade-offs that increase power consumption and reduce system gain;
 it is not fully integratable; and
 it is not easily applied to multi-standard/multi-frequency applications because the band pass and low pass filters 18, 24, 28 and 34 must be high quality devices; electronically tunable filters cannot be used. The only way to use the super-heterodyne system in a multi-standard/multi-frequency application is to use a separate set of off-chip filters for each frequency band.

Direct conversion architectures are different from super-heterodyne architectures in that they demodulate RF signals to baseband in a single step. By mixing the RF signal with a local oscillator signal at the carrier frequency, there is no image frequency, and no image components to corrupt the signal. Direct conversion receivers offer a high level of integratability, but also have several important problems.

A typical direct conversion receiver 36 is presented in the block diagram of FIG. 2. The RF band pass filter 18 first filters the signal coming from the antenna 20 (this band pass filter 18 may also be a duplexer). A low noise amplifier 22 then amplifies the filtered antenna signal, increasing the strength of the RF signal and reducing the noise figure of the receiver 36.

The signal is then mixed with a local oscillator signal using mixer 14 and a local oscillator 38. The local oscillator 38 generates a periodic signal which is tuned to the carrier frequency of the received signal, rather than an IF frequency as in the case of the super-heterodyne receiver 10. The signal coming from the output of mixer 14 is now at baseband, that is, the frequency at which the received signal was originally generated. The down-converted signal is then filtered using low pass filter 34, and may be amplified by amplifier 39. The baseband signal can now be amplified, digitized or converted in some other way, into a useful signal.

Direct conversion RF receivers 36 have several advantages over super-heterodyne systems in term of cost, power, and level of integration, however, there are also several serious problems with direct conversion. These problems include:

- noise near baseband (that is, 1/f noise) which corrupts the desired signal;
- local oscillator (LO) leakage in the RF path which creates DC offsets. As the LO frequency is the same as the carrier frequency of the incoming signal being demodulated, any leakage of the LO signal onto the antenna side of the mixer will pass through to the output side as well;
- local oscillator leakage into the RF path which causes desensitization. Desensitization is the reduction of desired signal gain as a result of receiver reaction to an undesired signal. The gain reduction is generally due to overload of some portion of the receiver, such as automatic gain control (AGC) circuitry, resulting in suppression of the desired signal because the receiver will no longer respond linearly to incremental changes in input voltage;
- RF-LO leakage can also couple to the on-chip voltage controlled oscillator (VCO) used to generate the local oscillator signal and degrade receiver performance, especially in phase-modulated systems; and
- large on-chip capacitors are required to remove unwanted noise and signal energy near DC, which makes integrability expensive. These capacitors are typically placed between the mixer 12 and the low pass filter 34.

Clearly, the problems listed above can be reduced significantly if the signals can be effectively isolated from one another. Unfortunately, this is very difficult to do in a cost effective and efficient way.

In "Solving the Direct Conversion Problem," Planet Analog, August 2001, D. Grant et al. propose a number of ways to reduce LO leakage including the following:

- good board design (for example, minimizing the length of LO traces to keep traces from acting like "antennas" which broadcast the LO signal);
- generous shielding, which can add cost and weight;
- generating an LO signal at a multiple or factor of what is required, then using a divider or multiplier to produce the actual LO where it is needed.

Grant et al. also describe the use of a simple regenerative divider circuit to produce an LO at 4/3 of the desired LO frequency, in an effort to avoid LO leakage problems.

However, Grant et al. do not offer any effective way of implementing such a circuit in an I and Q application. In many modulation schemes (particularly frequency modulation and phase modulation schemes), it is necessary to modulate or demodulate both in-phase (I) and quadrature (Q) components of the input signal, where I is 90 degrees out of phase with Q.

Simply modifying the Grant design to handle I and Q signals in the manner known in the art results in a circuit with almost as many filters and other components as required in previously known topologies. Thus, Grant et al. offer no real improvement in terms of integrability, cost and size reduction in applications requiring I and Q signals.

There is a great desire to provide modulation and demodulation circuits in a completely integrated form in the interest of providing smaller, lighter devices which are less expensive, and which consume less power. Discrete electronic components such as off-chip filters, are physically large, comparatively expensive and consume more power than integrated components. Clearly, topologies which require such off-chip components are undesirable.

However, fabricating fully-integrated receivers using cost-effective fabrication technologies is not without challenges. CMOS technology, for example, offers passive components with low quality factor and low self-resonant frequencies, which can pose problems, particularly at higher frequencies.

The continuing desire to implement low-cost, power efficient transmitters has proven especially challenging as the frequencies of interest in the wireless telecommunications industry (especially low-power cellular/micro-cellular voice/data personal communications systems) have risen above those used previously (approximately 900 MHz) into the spectrum above 1 GHz.

Thus, there is a need for a method and apparatus for demodulation which addresses the problems above. It is desirable that this design be fully-integratable, inexpensive and high performance.

SUMMARY OF THE INVENTION

It is therefore an object of the invention to provide a novel method and system of modulation and demodulation which obviates or mitigates at least one of the disadvantages of the prior art.

One aspect of the invention is defined as a synthesizer circuit for generating complementary sin and cos oscillator signals from an input oscillator signal x(t), the complementary sin and cos oscillator signals being shifting in frequency from the input oscillator signal x(t), the synthesizer circuit comprising: a divider having an input and generating divided sin and cos outputs based on a signal received at the input; a first mixer for receiving the input oscillator signal x(t), and mixing the input oscillator signal x(t) with the sin output of the divider to generate an output signal; a second mixer for receiving the input oscillator signal x(t), and mixing the input oscillator signal x(t) with the cos output of the divider to generate an output signal; a first removal means for receiving the output signal of the first mixer and removing undesired frequency signals from the output signal, providing the frequency-shifted cos oscillator signal as an output; the sin output of the first removal means also being connected to the input of the divider; and a second removal means for receiving the output signal of the second mixer and removing undesired frequency signals from the output signal, thus providing the frequency-shifted sin oscillator signal as an output.

Another aspect of the invention is defined as a demodulation circuit for down-converting an input signal RF, comprising: a synthesizer circuit as per claim 1, for generating complementary sin and cos oscillator signals, in combination with: a third mixer for receiving the input signal RF, and mixing the input signal RF with a multi-tonal mixing signal φ1, to generate an output signal φ1 RF; a fourth mixer for receiving the signal φ1 RF as an input, and mixing the signal φ1 RF with a mono-tonal mixing signal φ2, to generate an output signal φ1 φ2 RF; first and second signal generators for receiving the complementary sin and cos oscillator signals from the synthesizer circuit; the first signal generator for generating the multi-tonal mixing signal φ1; and the second signal generator for generating the mono-tonal mixing signal φ2, where φ1*φ2 has significant power at the frequency of a local oscillator signal being emulated, and neither of the φ1 nor the φ2 having significant power at the carrier frequency of the input signal RF or the LO signal being emulated.

BRIEF DESCRIPTION OF THE DRAWINGS

These and other features of the invention will become more apparent from the following description in which reference is made to the appended drawings in which.

DESCRIPTION OF THE INVENTION

The invention uses regenerative dividers to generate the quadrature components of the local oscillator signal required for up- or down-conversion. In the case of demodulation using direct conversion, these local oscillator signals will have the same frequency as the carrier frequency of the received RF signal. The invention is generally described with respect to such a case, but clearly, the invention can be applied to the generation of local oscillator signals for any up- or down-conversion architecture.

Figure 1:
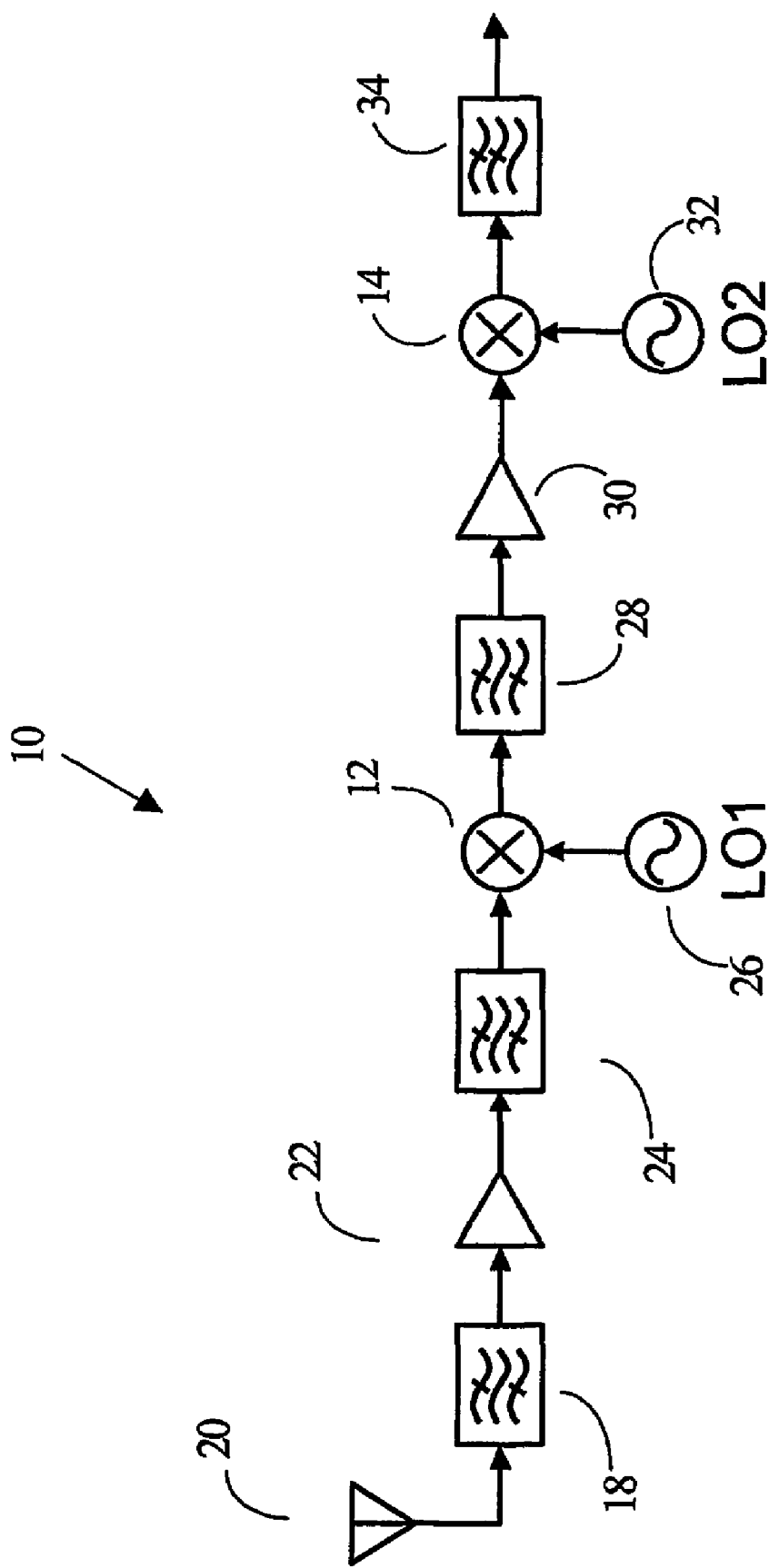
FIG. 1 presents a block diagram of a super-heterodyne down-conversion topology as known in the art.
Figure 2:
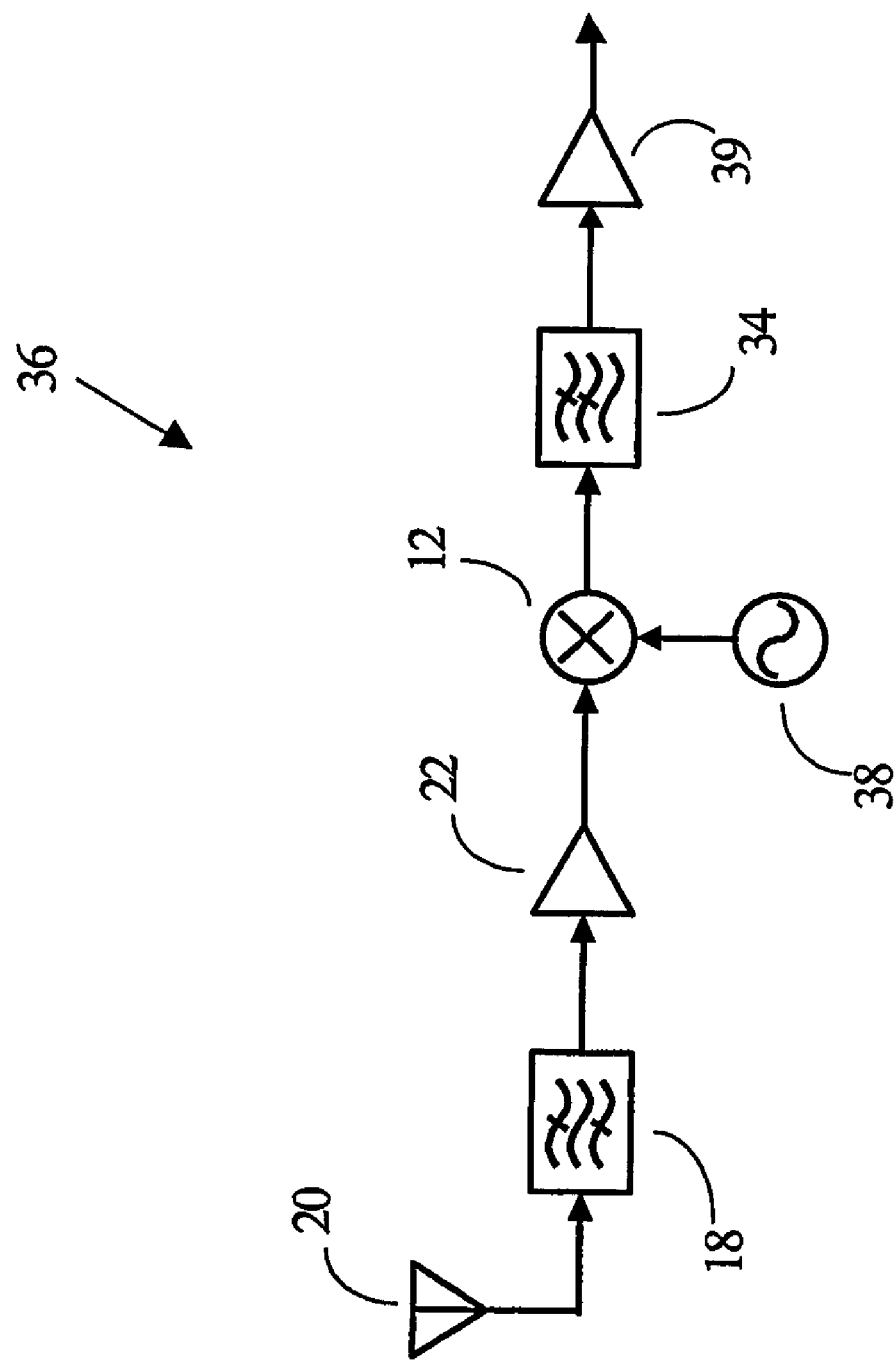
FIG. 2 presents a block diagram of a direct-conversion topology as known in the art.
Figure 3:
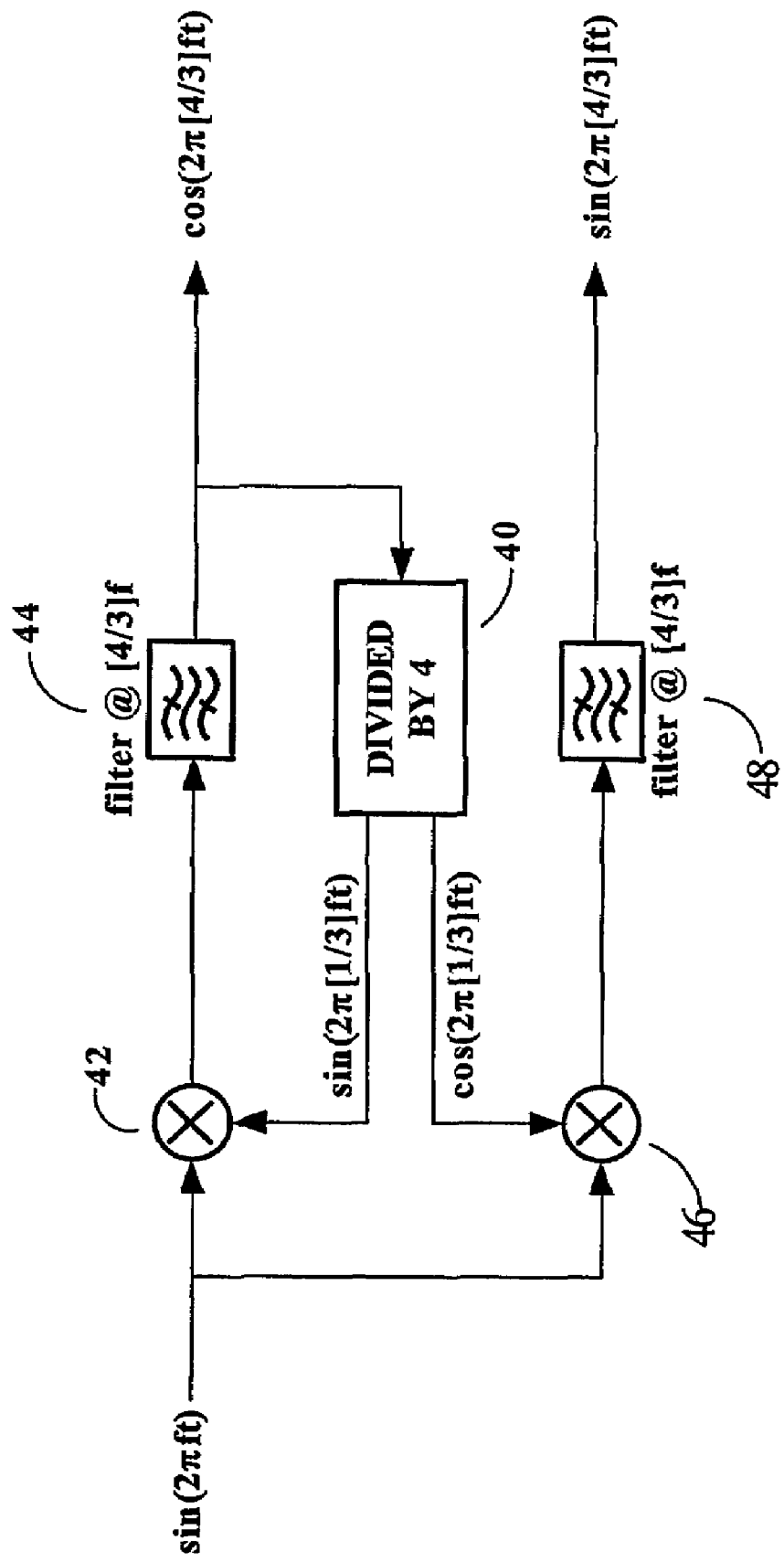
FIG. 3 presents a block diagram of a synthesizer to generate narrowband oscillator signals for modulation/demodulation, in a broad embodiment of the invention.
Figure 4:
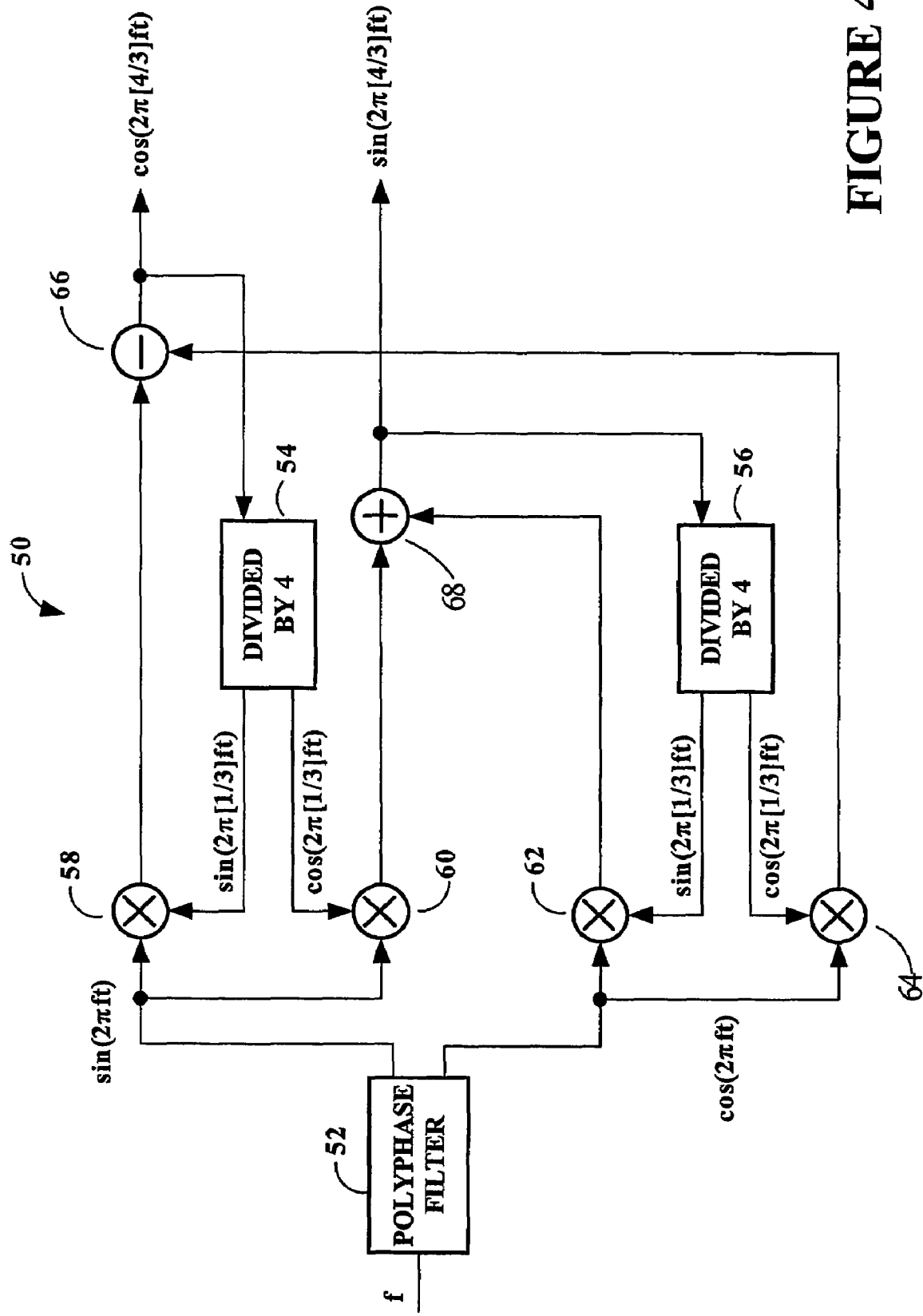
FIG. 4 presents a block diagram of a synthesizer to generate wideband oscillator signals for modulation/demodulation, in an embodiment of the invention.

Two exemplary regenerative divider circuits which address a number of the objects of the invention are shown in the block diagrams of FIGS. 3 and 4, FIG. 3 presenting a circuit for narrow band applications, and FIG. 4 presenting a circuit for wide band applications. Both of these exemplary architectures use 3/4 of the carrier frequency as the frequency of the local oscillator signal being input to the circuit—denoted as frequency, f. That is, both circuits are designed to receive an input oscillator signal f, which has a frequency equal to 3/4 of that of the desired output frequency (the LO signal). Other divider arrangements could also be used, resulting in other relationships between the input and output frequencies.

The narrow band circuit uses a divide-by-four element 40 to generate the quadrature components at a frequency of 4/3 the incoming signal. The circuit of FIG. 3 consists of two regenerative feedback loops, both fed by the same divide-by-4 element 40. The input oscillator signal sin(2[]it is mixed with a sin(2π [1/3] f t) signal output from the divide-by-4 element 40. The analysis of the signals can be performed as follows:

As noted above, the output of a mixer can generally be described as including the sum and difference of the two inputs, plus the inputs themselves. The two signals being fed into the first mixer 42 will be filtered by the band pass filter 44, so they can be ignored for the sake of this analysis. This leaves two signals at the following frequencies:

$$f_{OUT} = f_{IN} + [1/4] f_{OUT} \qquad (1)$$

$$f_{OUT} = f_{IN} - [1/4] f_{OUT} \qquad (2)$$

Substracting [1/4] $f_{OUT}$ from both sides of equation (1), it can be simplified as follows:

$$[3/4] f_{OUT} = f_{IN}$$

$$f_{OUT} = [4/3] f_{IN} \qquad (3)$$

The bandpass filter 44 is centered at [4/3] f, which filters out all but the desired [4/3] f signal. The mixing of the two sin signals causes the output to shift to a cos signal, so the input sin(2π f t) becomes an output cos(2π [4/3] f t) signal. The bandpass filter 44 also helps remove harmonics produced by the divide-by-4 element 40 and the first mixer 42 (when manipulating RF signals, harmonic signals are often generated—harmonics are simply integral multiples of the frequency of the sinusoid waves being handled. The frequency of the sinusoid wave is called the fundamental frequency or the first harmonic, the second harmonic is twice the fundamental frequency, the third harmonic is thrice the fundamental frequency, etc.)

The other leg of this circuit operates in much the same way. However, rather than mixing the input oscillator signal sin(2π f t) with a sin(2π [1/3] f t) signal output from the divide-by-4 element 40, it is mixed with a cos(2π [1/3] f t) signal using a second mixer 46. When this mixed signal is passed through the second bandpass filter 48, the output is the desired sin(2π [4/3] f t) signal.

Thus, this circuit generates a quadrature pair of LO signals at 4/3 of the frequency of the incoming signal. As noted, having a local oscillator (LO) at the same frequency as that of the incoming signal can allow self-mixing to occur, degrading system performance. Using signals at a different frequency than that of the incoming signal x(t) reduces the degree of self-mixing. Note that the component count and form factor of the design of the invention is much less than that of the prior art circuits.

The two signal branches (i.e. 42 and 44 being one branch, and 46 and 48 being the other) should be as symmetric as possible. It may be necessary to attach a dummy divide-by-4 element to the bottom branch to increase the amount of symmetry (the dummy divider would be attached only at its input, and the output of the dummy would be unattached).

Figure 5:
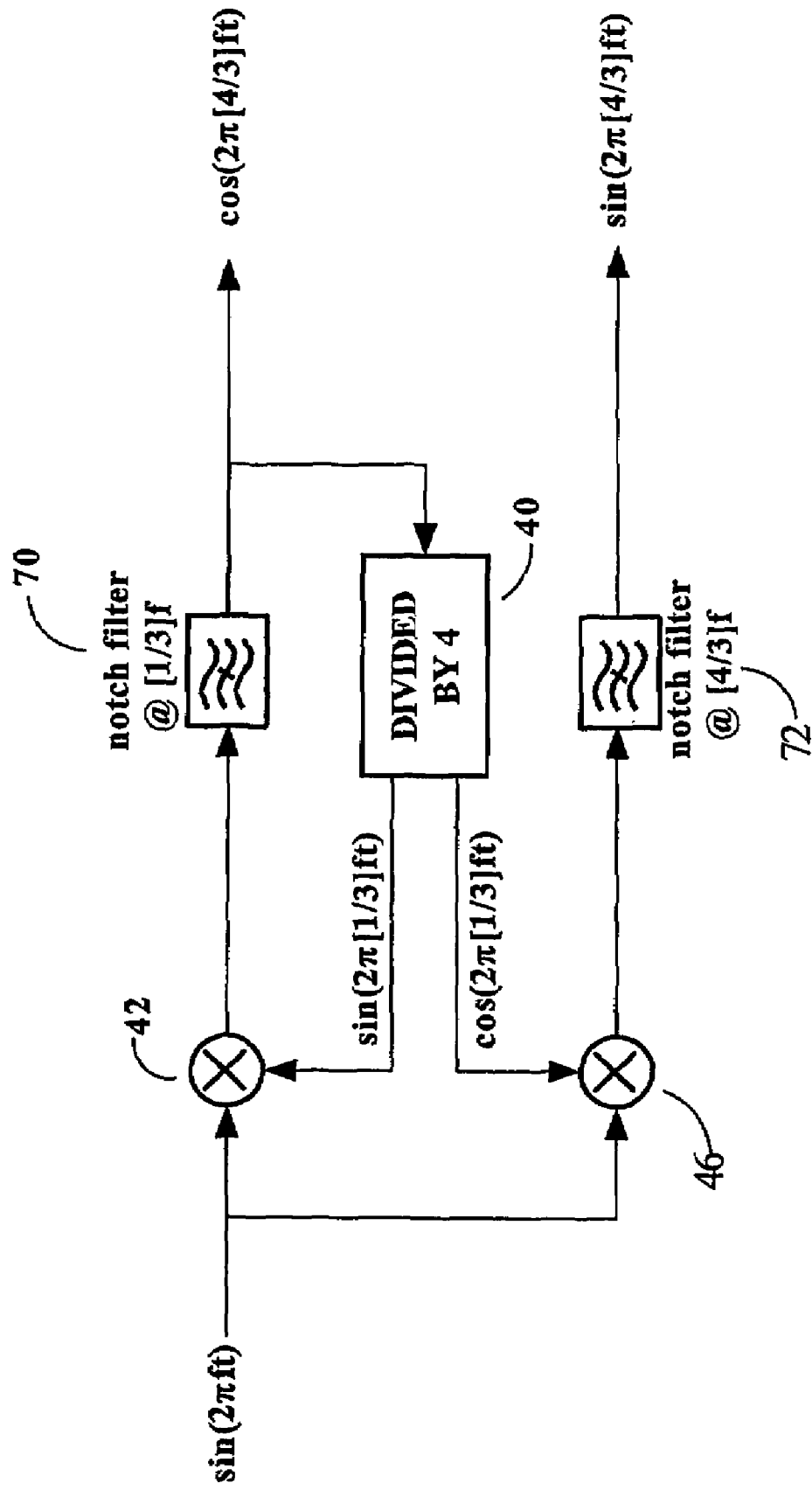
FIG. 5 presents a block diagram of a synthesizer to generate narrowband oscillator signals for modulation/demodulation, employing a notch filter, in an embodiment of the invention.

One of the harmonics that needs to be removed is the one at 1/3 of the f frequency. This harmonic can be removed using bandpass filters 44, 48 as shown in FIG. 3 or using notch filters 70, 72 centered at [1/3] f as shown in FIG. 5. In the wide band circuit 50 of FIG. 4, the [1/3] f signal is removed using a quadrature subtraction technique, and a poly-phase filter 52 is used to produce quadrature elements of the LO.

The circuit 50 of FIG. 4 consists of four regenerative feedback loops, employing two divide-by-4 elements 54, 56. The input oscillator signal with a frequency of f, is fed to a polyphase filter 52 which produces quadrature oscillator signals $\sin(2\pi f t)$ and $\cos(2\pi f t)$. These two oscillator signals are fed to a pair of regenerative feedback circuits which are, individually, much like that of FIG. 3.

Polyphase filters are selective filters which can discriminate between positive and negative frequencies. Their usual application is with regard to the removal of image signals when modulating and demodulating RF signals. The polyphase filter 52 of FIG. 4, is being used for quite a different purpose.

The $\sin(2\pi f t)$ oscillator signal is fed to a pair of mixers 58, 60 which mix this oscillator signal respectively, with $\sin(2\pi [1/3] f t)$ and $\cos(2\pi [1/3] f t)$ signals from the divide-by-4 element 54. The same process occurs to the $\cos(2\pi f t)$ oscillator signal which is fed to a pair of mixers 62, 64 which mix this oscillator signal, respectively, with $\sin(2\pi [1/3] f t)$ and $\cos(2\pi [1/3] f t)$ signals from the divide-by-4 element 56. In general, these mixers 58, 60, 62, 64 would be harmonic rejection mixers (HRMs).

Rather than using a bandpass filter to remove the unwanted signal components from the mixer outputs, as in FIG. 3, this circuit 50 uses quadrature subtraction. The output of mixer 64 is subtracted from the output of mixer 58 using adder 66, leaving a single signal: $\cos(2\pi[4/3] f t)$. Similarly, the output of mixer 60 is summed with the output of mixer 62 using adder 68, leaving the signal: $\sin(2\pi[4/3] f t)$. Techniques other than filtering or quadrature subtraction could also be used to cancel, remove, or ignore the unnecessary signals.

Note that particular design parameters for the mixers of FIGS. 3-5 would be clear to one skilled in the art, having the typical properties of an associated noise figure, linearity response, and conversion gain. The selection and design of these mixers would follow the standards known in the art.

Though these figures imply that various elements are implemented in analogue form, they can also be implemented in digital form. The mixing signals are typically presented herein in terms of binary 1s and 0s, however, bipolar waveforms, ±1, may also be used. Bipolar waveforms are typically used in spread spectrum applications because they use commutating mixers which periodically invert their inputs in step with a local control signal (this inverting process is distinct from mixing a signal with a local oscillator directly).

As well, the invention was described above with respect to the terms "narrowband" and "wideband". These terms are usually subjectively defined, relative to the context. A narrowband signal is generally a signal whose spectral content is limited to a narrow channel; typically ~20 MHz for a single wireless standard. In contrast, "wideband" generally refers to a bandwidth of >20 MHz, or a multiple of a wireless standard.

The invention was also described in the context of a direction-conversion application, but of course, the invention could easily be applied to other methodologies. Near Zero-IF (or Low-IF) is a typical example.

Near Zero-IF conversion is similar to direct conversion, in that the RF band is brought close to baseband in a single step. However, with Near Zero-IF the desired signal is not brought exactly to baseband, and therefore DC offsets and 1/f noise do not contaminate the signal.

Exemplary Implementation with VLO (Virtual Local Oscillator) Signals

An implementation of the invention with respect to "virtual local oscillator" (VLO) signals is presented in FIGS. 6-10. As will be described, VLO signals are pairs of mixing signals φ1 and φ2 which can be used for up-converting or down-converting. While two mixing signals are required, they are very different from the two mixing signals used in normal two-step conversion topologies such as superheterodyne topologies. The main difference from the direct-conversion approach is that two mixing signals of the invention are used emulate a single mixing signal, but they do this without the usual short comings of direct-conversion, such as self-mixing.

Figure 6:
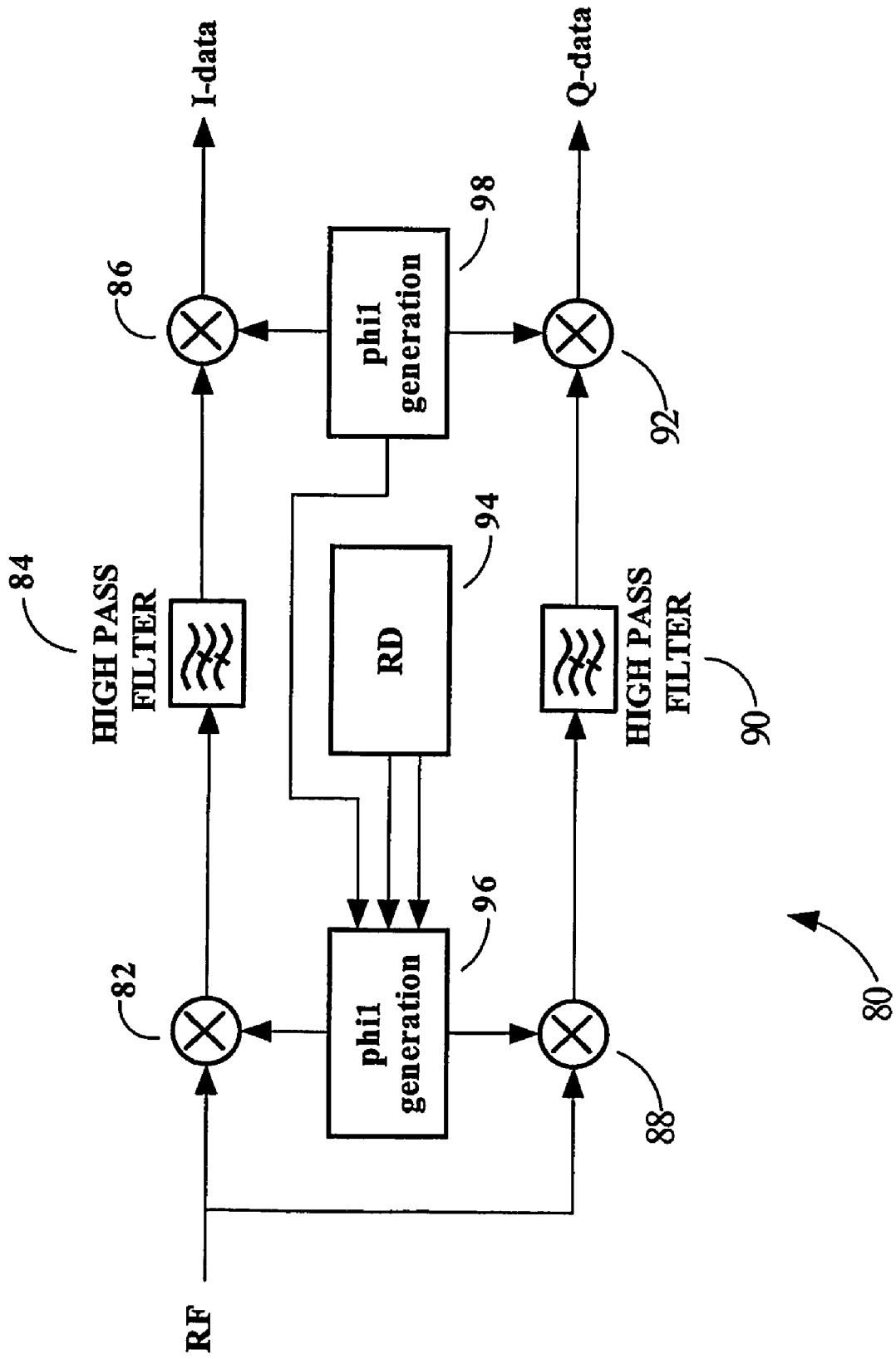
FIG. 6 presents a block diagram of a synthesizer to generate virtual local oscillator (VLO) signals for modulation/demodulation, in an embodiment of the invention.

As shown in the block diagram of the VLO topology 80 in FIG. 6, the input signal RF is mixed with a multi-tonal mixing signal φ1 using a first mixer 82 (multi-tonal, or non-mono-tonal, refers to a signal having more than one fundamental frequency tone. Mono-tonal signals have one fundamental frequency tone and may have other tones that are harmonically related to the fundamental tone). The resulting signal, φ1 x(t), is then passed through a high pass filter 84, and is mixed with a mono-tonal signal φ2 by means of a second mixer 86, generating an in-phase output signal φ1 φ2 x(t). These mixing signals φ1 and φ2 are generally referred to herein as "virtual local oscillator" (VLO) signals because they emulate a local oscillator signal. The product φ1*φ2 has significant power at the frequency of a local oscillator signal being emulated. However, neither φ1 nor φ2 have significant power at the frequency of the input signal x(t), the LO signal being emulated, or the output signal φ1, φ2 x(t). Mixing signals with such characteristics greatly resolve the problem of self-mixing because the VLO signals simply do not have significant power at frequencies that will interfere with the output signal.

Figure 7:
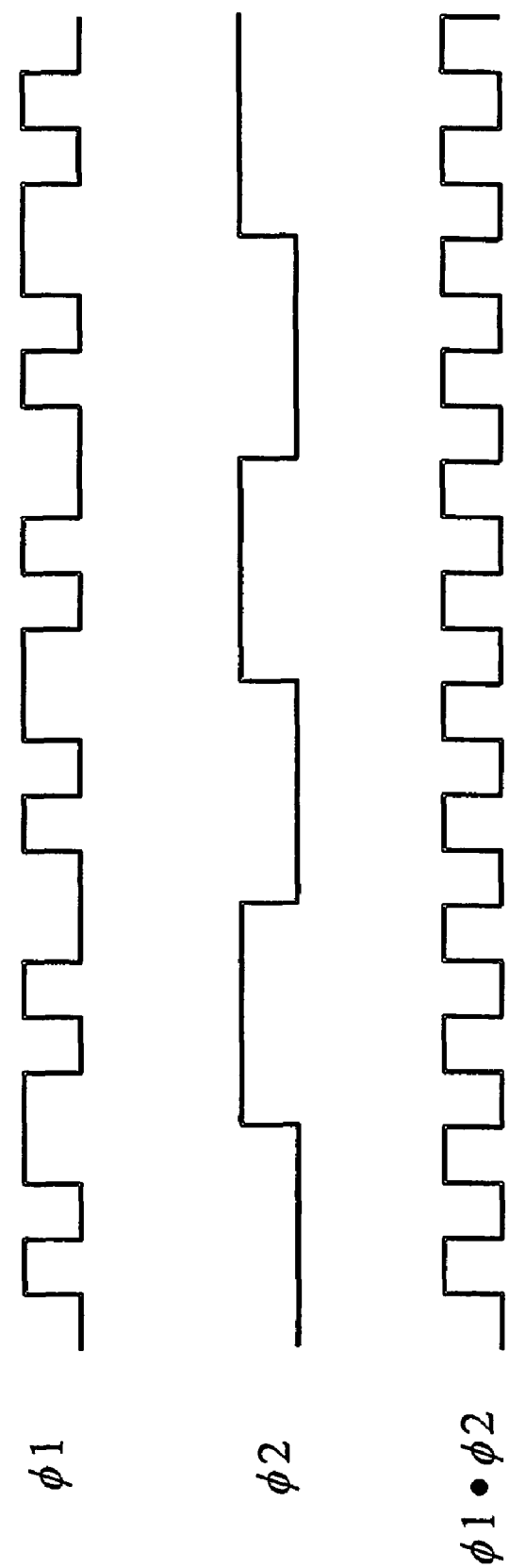
FIG. 7 presents a timing diagram of an exemplary pair of VLO mixing signals, in an embodiment of the invention.

An exemplary pair of φ1 and φ2 mixing signals is presented in FIG. 7, plotted in amplitude versus time. It is clear that the product of these two mixing signals, φ1*φ2, is equal to the desired LO signal. Thus, the output φ1 φ2 x(t) from mixer 86 of FIG. 6 will be equal to the output of a hypothetical LO*x(t) down conversion. It is also clear from FIG. 7 that neither φ1 nor φ2 have a significant amount of power at the frequency of LO=φ1*φ2.

In fact, at no point in the operation of the circuit is an actual "φ1*φ2" signal ever generated and if it is, only an insignificant amount is generated. The mixers 82, 86 receive separate φ1 and φ2 signals, and mix them with the input signal x(t) using different physical components. Hence, there is no LO signal which may leak into the circuit.

Looking at one cycle of these mixing signals from FIG. 7 the generation of the φ1*φ2 signal is clear:

TABLE I

Exemplary VLO Mixing Signals

| φ2 | φ1 | φ1 * φ2 |
|---|---|---|
| LO | LO | LO |
| LO | HI | HI |
| LO | LO | LO |
| LO | HI | HI |
| HI | HI | LO |
| HI | LO | HI |
| HI | HI | LO |
| HI | LO | HI |

Clearly, the two mixing signals φ1 and φ2 in FIG. 7 satisfy the criteria for effective VLO signals.

In FIG. 6, two signal channels are shown: one for an in-phase component of the input signal, consisting of mixers 82 and 86 and high pass filter 84, and one for a quadrature component of the input signal, consisting of mixers 88 and 92 and high pass filter 90. These two sets of mixers and filters are the same; the only difference is that the two sets of mixing signals are 90 degrees out of phase with one another.

This circuit uses a regenerative divider circuit 94 such as one described above with respect to any one of FIGS. 3-5, to provide in-phase and quadrature oscillator signals to the φ1 generator 96. A signal used to generate φ2 in φ2 generator 98 is provided to φ1 generator 96. φ1 generator 96 uses the in-phase and quadrature oscillator signals, and the signal provided by φ2 generator 98 to generate φ2. The φ1 generator 96 and φ2 generator 98 could be any arrangement of logic or other circuitry required to generate VLO signals as described herein. A large number of co-pending patent applications have also been filed by the Applicant describing various manners of generating such VLO signals. These patent applications include the following:

1. PCT International Application Serial No. PCT/CA00/00995 Filed Sep. 1, 2000, titled: "Improved Method And Apparatus For Up-Conversion Of Radio Frequency (RF) Signals";
2. PCT International Application Serial No. PCT/CA00/00994 Filed Sep. 1, 2000, titled: "Improved Method And Apparatus For Down-Conversion Of Radio Frequency (RF) Signals";
3. PCT International Application Serial No. PCT/CA00/00996 Filed Sep. 1, 2000, titled: "Improved Method And Apparatus For Up-And-Down-Conversion Of Radio Frequency (RF) Signals"; and
4. PCT International Application Serial No. PCT/CA01/00876 Filed Jun. 19, 2001, titled: "Improved Method And Apparatus For Up-And-Down-Conversion Of Radio Frequency (RF) Signals".

Figure 8:
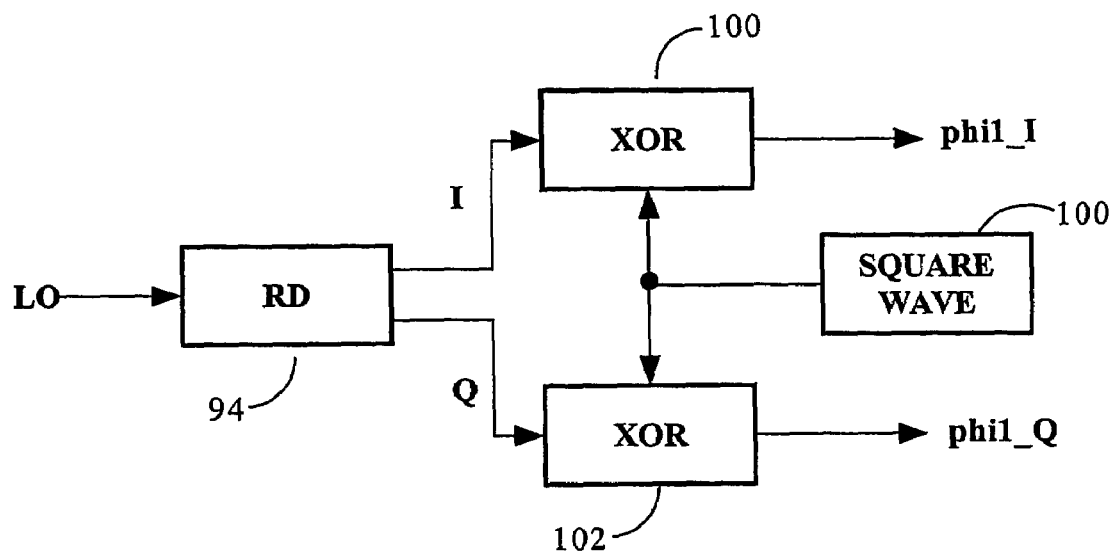
FIG. 8 presents a block diagram of a circuit for generating I and Q components for a VLO mixing signal, in an embodiment of the invention.

One method of generating φ1I and φ1Q is shown in the block diagram of FIG. 8. The regenerative divider circuit 94 is the same as the one in FIG. 6, but the φ1 generator 96 has been replaced with a pair of XOR gates 100, 102 and a square wave generator 104. The square wave can be generated from a frequency-controlled oscillator or in some similar manner. The frequency of the square wave may be varied, as may the "digital" pattern. It is important to note though, that the square waveform has to have an average value of zero (assuming it is swinging between +1 and −1).

Figure 9:
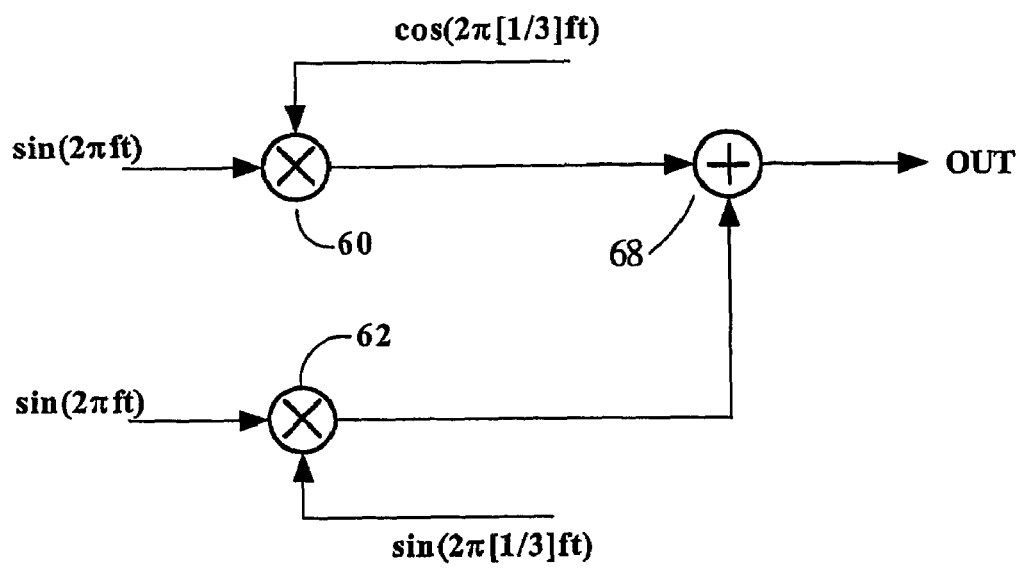
FIG. 9 presents a block diagram of a portion of the circuit in FIG. 4 so that portion of the circuit can be analysed.

In this exemplary embodiment, the wideband version of the invention from FIG. 4 is being employed. FIG. 9 presents a block diagram of a portion of that circuit, so that the signals can be analysed.

As described above, the divide-by-four elements 54, 56 and the mixer configuration will cause the frequency component at f to be multiplied with a square wave signal at a frequency of [1/3] f. FIG. 9 presents a block diagram of mixers 60, 62 and adder 68 from FIG. 4, showing the inputs to these components. Under ideal conditions and ideal matched conditions, the output of this portion of the circuit will be as follows:

TABLE II

Output of FIG. 9, where fundamental is 4/3*f

| Nth tone | Relative mag. | Component (sine) | tone |
|---|---|---|---|
| 1 | 1 | (4/3)*f | fund |
| 3 | 38046 | 0*f | DC |
| 5 | 38107 | (8/3)*f | 2*fund |
| 7 | 38168 | (4/3)*f | fund |
| 9 | 38230 | 4*f | 3*fund |
| 11 | 38291 | (4/3)*f | 2*fund |
| 13 | 38352 | 4*f | 3*fund |
| 15 | 1/15 | 4*f | 3*fund |

Figure 10:
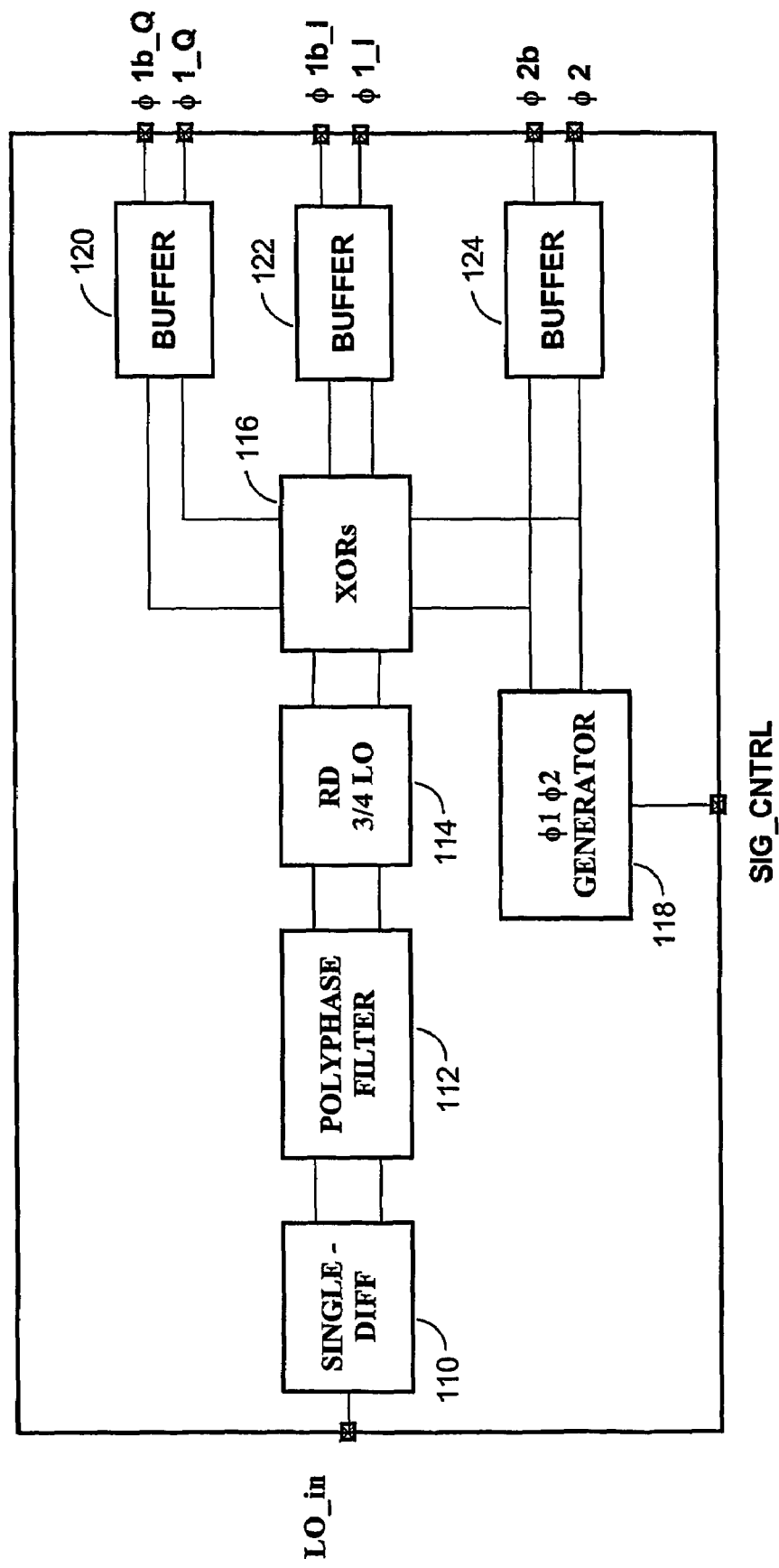
FIG. 10 presents a top-level block diagram of a synthesizer for generating a complete set of VLO mixing signals for modulation/demodulation, in an embodiment of the invention.

A practical embodiment of this design as a single chip, is presented in the block diagram of FIG. 10. An single-ended oscillator signal LO_in is received and is converted to a differential signal using a linear wide band single to differential converter (range of 525-1875 MHz) 110. This differential signal is then fed to a differential wide band poly phase filter 112 with a frequency range of 525-1875 MHz. Differential sin(2π ft) and cos (2π ft) signals are then sent to a differential regenerative divider 114. Apart from the fact that this regenerative divider 114 uses differential signalling, it is the same as that of FIG. 4.

The differential sin(2π [4/3] ft) and cos (2π [4/3] ft) signals from the differential regenerative divider 114 are then fed to a block of XOR gates, which is interconnected with the φ1 and φ2 generation block 118. As noted above, the structure of the φ1 and φ2 generation block 118 is the subject of various co-pending patent applications. The differential φ1bI, φ1bQ, φ1I, φ1Q, φ2I and φ2Q signals are then fed through buffers 120, 122, 124 and output from the chip, so they can be connected to mixers (note that the φ1bI, φ1bQ signals the 180 degree complements of φ1I, φ1Q, required for the differential signalling).

A summary of the current estimates and frequency ranges for the components in the embodiment of FIG. 10, are presented in the table below.

TABLE III

Current estimates and frequency range of components

| Element | Estimated current (mA) | Min Freq. (MHz) | Mx Freq. (MHz) | Voltage Range (mV) - Min. | Voltage Range (mV) - Max. |
|---|---|---|---|---|---|
| Single-Diff. | 1 | 525 | 1875 | | |
| Polyphase | 0 | 525 | 1875 | | |
| RD | 2 | 525 | 2500 | | |
| XORs | 1 | 700 | 2500 | | |
| Sqgen | 1 | 25 | 175 | | |

TABLE III-continued

Current estimates and frequency range of components

| Element | Estimated current (mA) | Min Freq. (MHz) | Mx Freq. (MHz) | Voltage Range (mV) - Min. | Voltage Range (mV) - Max. |
|---|---|---|---|---|---|
| Buffers1 | 3 | 700 | 2500 | 1200 | 1800 |
| Buffers2 | 3 | 25 | 150 | 0 | 1800 |
| Total | 14 | NA | NA | | |

While this circuit contains many components that are similar to commonly used demodulation topologies, it uses them in a unique way. Thus, this circuit:
1. allows an input signal x(t) to be down-converted using a completely integratable circuit;
2. does not use mixing signals that contain significant power at the frequency of the local oscillator signal being emulated. Thus, the frequency translation is still effected, but self-mixing and unwanted mixing products are avoided; and
3. is particularly convenient when applied to the development of multi-standard/multi-frequency devices because no filters are required, and because the mixing signals can be generated and varied so easily. This advantage will become more clear from the description which follows.

Other advantages of the invention will also become clear from the other embodiments of the invention described hereinafter.

Virtual Local Oscillator Signals

An exemplary set of VLO signals were described hereinabove. The purpose of this section is to present VLO signals in a more general way, as any number of VLO signals could be generated with which the invention could be implemented.

A periodic or time-varying mixing signals offer advantages over previously used mono-tonal oscillator signals. A given pair of these virtual local oscillator (VLO) signals $\phi 1$ and $\phi 2$ have the properties that:
1. their product emulates a local oscillator (LO) signal that has significant power at the frequency necessary to translate the input signal x(t) to the desired output frequency. For example, to translate the input signal x(t) to baseband, $\phi 1(t)*\phi 2(t)$ must have a frequency component at the carrier frequency of x(t); and
2. one of either $\phi 1$ and $\phi 2$, has minimal power around the frequency of the mixer pair output $(\phi 1(t)*\phi 2(t)*x(t)$, while the other has minimal power around the centre frequency, $f_{RF}$, of the input signal x(t). "Minimal power" means that the power should be low enough that it does not seriously degrade the performance of the RF chain in the context of the particular application.
   For example, if the mixer pair is demodulating the input signal x(t) to baseband, it is preferable that one of either $\phi 1$ and $\phi 2$ has minimal power around DC.

As a result, the desired demodulation is affected, but there is little or no LO signal to leak into the signal path and appear at the output.

As noted above, mixing two signals together generates an output with:
(a) a signal equal in frequency to the sum of the frequencies of the input signals;
(b) a signal equal in frequency to the difference between the frequencies of the input signals; and
(c) the original input frequencies.

Thus, direct conversion receivers known in the art must mix the input signal x(t) with a LO signal at the carrier frequency of the input signal x(t). If the LO signal of a direct conversion receiver leaks into the signal path, it will also be demodulated to baseband along with the input signal x(t), causing interference. The invention does not use an LO signal, so leakage does not generate a signal at the baseband output $\phi 1(t)*\phi 2(t)*x(t)$.

Any signal component at the frequency of the input signal x(t) or the output signal $\phi 1(t)*\phi 2(t)*x(t)$, in either of the mixing signals $\phi 1$ and $\phi 2$, is suppressed or eliminated by the other mixing signal. For example, if the mixing signal $\phi 2$ has some amount of power within the bandwidth of the up-converted RF (output) signal, and it leaks into the signal path, then if will be suppressed by the $\phi 1$ mixing signal which has minimal power within the bandwidth of the up-converted RF (output) signal. This complementary mixing suppresses interference from the mixing signals $\phi 1$ and $\phi 2$.

As noted above, current receiver and transmitter technologies have several problems. Direct-conversion transceivers, for example, suffer from LO leakage and 1/f noise problems which limit their capabilities, while heterodyne transceivers require image-rejection techniques which are difficult to implement on-chip with high levels of performance.

The problems of image-rejection, LO leakage and 1/f noise in highly integrated transceivers can be overcome by using the complementary VLO signals. These signals are complementary in that one of the $\phi 1$ and $\phi 2$ signals has minimal power around the frequency of the output signal y(t) (which is around DC if conversion is to baseband), and the other has minimal power around the centre frequency, $f_{RF}$, of the input signal x(t).

These signals $\phi 1$ and $\phi 2$ can, in general, be:
1. random or pseudo-random, periodic functions of time;
2. analogue or digital waveforms;
3. constructed using conventional or non-conventional bipolar waves;
4. averaging to zero;
5. amplitude modulated; and
6. generated in a number of manners including:
   a. being stored in memory and clocked out;
   b. being generated using digital blocks;
   c. being generated using noise shaping elements (e.g. delta-sigma elements); or
   d. being constructed using PN sequences with additional bits inserted so they comply to the above conditions.

It would be clear to one skilled in the art that virtual LO signals may be generated which provide the benefits of the invention to greater or lesser degrees. While it is possible in certain circumstances to have almost no LO leakage, it may be acceptable in other circumstances to incorporate virtual LO signals which still allow a degree of LO leakage.

Virtual local oscillator signals may also be generated in different forms, such as using three or more complementary signals rather than the two mixing signals shown above. As noted above, these and other variations are described in the following co-pending PCT patent applications filed under Ser. Nos. PCT/CA00/00994, PCT/CA00/00995 and PCT/CA00/00996.

Exemplary Implementation in CMOS

The local oscillator generation scheme of the invention, for use in Low-IF and Direct Conversion architectures, was implemented in 0.18 μm CMOS. This fully-integrated, ratio-based local oscillator (LO) generation scheme uses regenerative division, and consumes 27 mW from a 1.8 V supply. The entire chip is fully integrated, including on-chip spiral inductors; harmonic rejection mixers are also employed to suppress unwanted mixing products to better than −36 dBc. Across an RF band of 150 MHz, a quadrature phase error of less than 2° and a maximum image suppression of 36 dB is achieved. Using a 4/3 multiplication factor to generate the local oscillator, LO-RF interactions are reduced and an LO-RF leakage of −86 dBm has been measured at the mixer input.

Designing a fully-integrated direct conversion receiver in CMOS is not without challenges. In addition to the RF-LO leakage problems described above, CMOS technology offers passive components with low quality factor and low self-resonant frequencies, which can pose problems for the realization of higher frequency (eg. 5 GHz) designs. As such, careful LO planning is necessary in the design of a direct conversion receiver.

This embodiment of the invention implements a fractional-based LO generation scheme in a 1.8 V, 0.18 μm, single-poly, 6-metal bulk CMOS process for direct conversion or low-IF architectures. On-chip spiral inductors and harmonic rejection mixers are used to suppress unwanted mixing products. The LO system is implemented along with direct down-conversion mixers to facilitate testing.

As noted in the Background to the Invention, others have attempted design regenerative circuits to generate local oscillator signals, but they have not provided designs which are effective in producing in-phase and quadrature LO signals. Since the LO is not generated in quadrature, a polyphase circuit could be inserted in the received RF signal path, but this polyphase would add loss and noise to the system (see F. Behbahani et al., "CMOS Mixers and Polyphase Filters for Large Image Rejection," IEEE J. Solid-State Circuits, vol. 36, pp. 873-886, June, 2001, for example). Other LO generation schemes have been described which require a polyphase filter at the output to generate quadrature LO, which also results in poor performance due to losses and noise.

The system which was fabricated uses regenerative division, provides quadrature LO signals without using a polyphase filter at the output, and employs harmonic-rejection mixers (HRM). Thus, this circuit provides I and Q LO components with higher quality than other integration attempts in the past.

Figure 11:
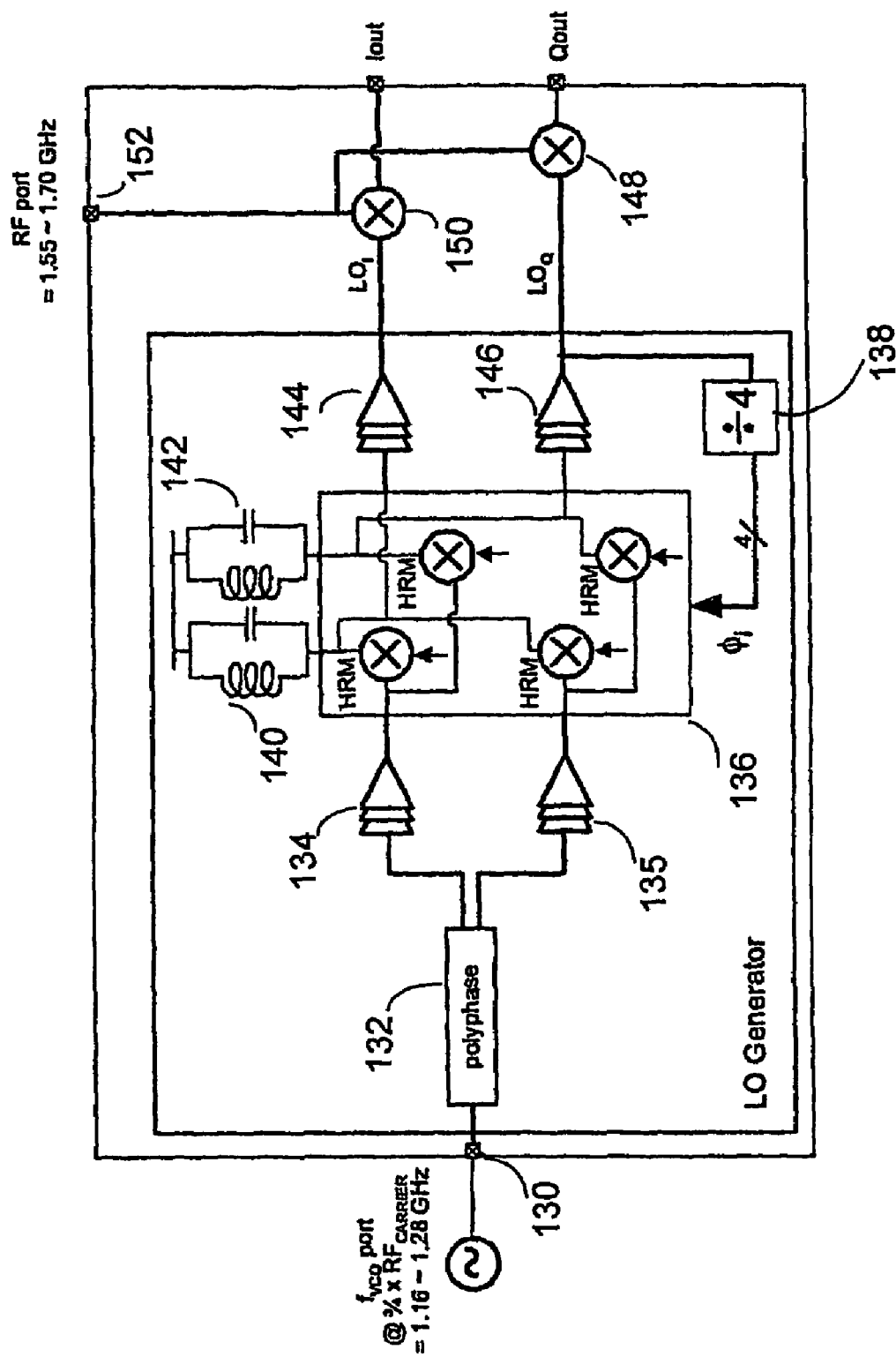
FIG. 11 presents a block diagram of an exemplary down-converter implemented in CMOS, in an embodiment of the invention.

The architecture of this embodiment is presented in the block diagram of FIG. 11. While single lines are used for each signal path in this Figure, all of the signal paths in the actual chip are fully differential. Differential signals are signals which have positive and negative potentials with respect to ground, rather than only one potential with respect to ground (for example, a measurement on a pair of wires might indicate that one if +1.3 V, while the other is −1.3V. This is in contrast to the measurements being 0 and +1.3V, for example). It would be clear to one skilled in the art, how to implement all of the components of the invention is differential form.

The use of a differential signalling results in stronger output signals and better noise resistance (particularly resistance to common mode noise) than single ended signalling. If, for example, environment noise imposes a noise signal on an input, then this noise signal will propagate through the circuit. However, if this environmental noise is imposed equally on the positive and negative inputs of a differential circuit, then the net effect will be zero.

The circuit of FIG. 11 is designed to receive an input oscillator signal at the $f_{VCO}$ port which is at 3/4 of the RF carrier frequency (i.e. the input signal is at 3/4 of the frequency of the desired output). In this particular application, this is a signal at 1.16~1.28 Ghz. This signal is referred to as a VCO signal, because generally it will be produced using a voltage controlled oscillator.

Figure 12:
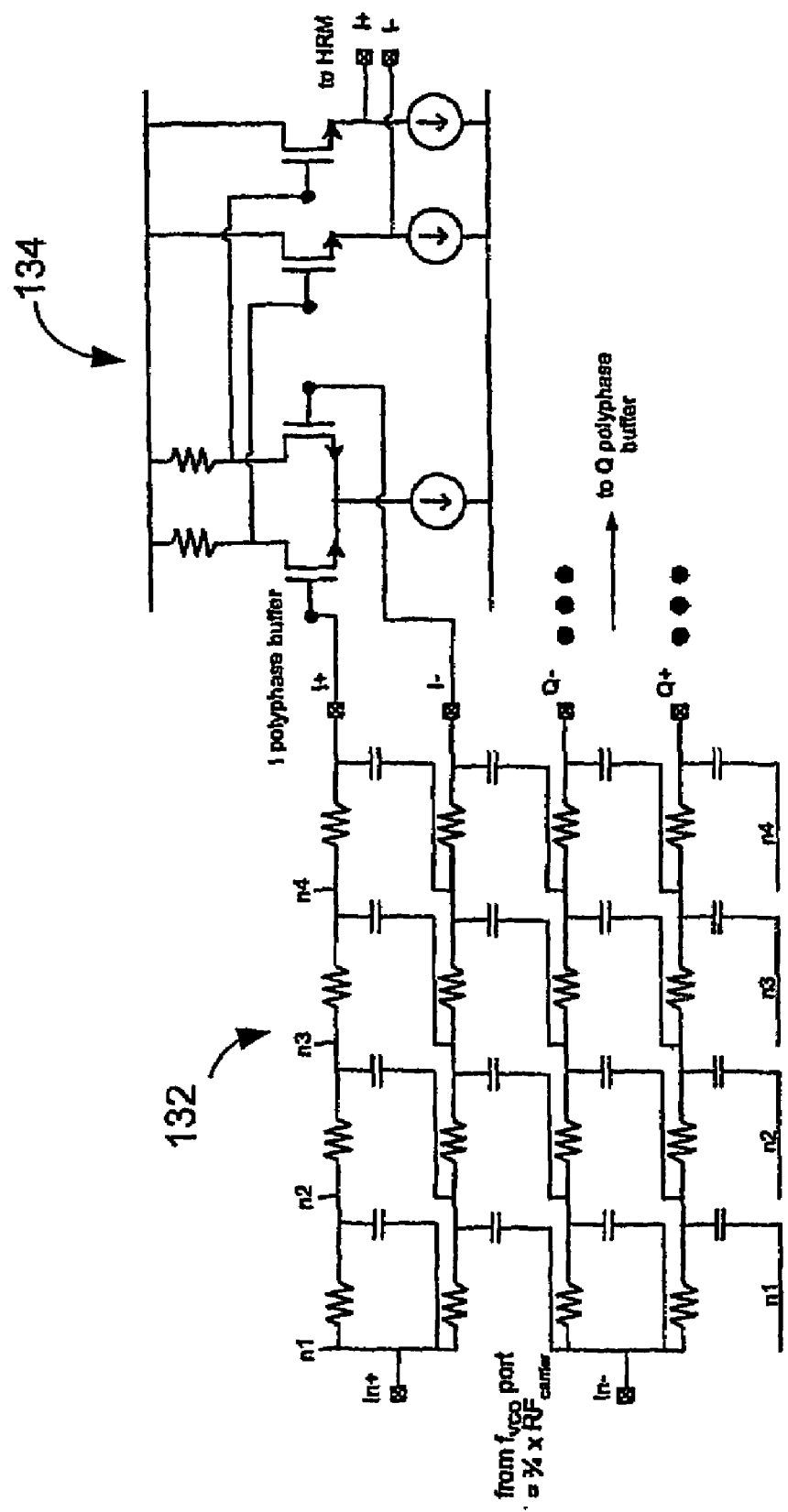
FIG. 12 presents a circuit diagram of a 4-section polyphase filter and amplifier used in the exemplary CMOS down-converter of FIG. 11.

The VCO signal from the $f_{VCO}$ port 130 is fed to a stagger-tuned four-stage polyphase filter 132 which generates quadrature signals from 600 to 1795 MHz. To account for the loss of the polyphase filter 132, it is followed by a gain stage which consists of a pair of common-source, differential amplifiers 134, 135. The polyphase filter 132 consists of a grid-work of resistors and capacitors as shown in FIG. 12. FIG. 12 also shows the specific circuit used to implement the amplifiers 134, 135.

The amplified signals are then fed to the four harmonic rejection mixers (HRMs) 136. A divide-by-four circuit 138 is used in feedback to generate the 4/3 multiplication factor.

A pair of tuned LC tanks 140, 142 form the load for the HRMs and are used to suppress the unwanted mixing products generated as a result of the harmonics produced by the divide-by-four circuit. An integrated 8.2 nH inductor with a quality factor of 4.5 was designed using ASITIC (see A. Niknejad and R. Meyer, "Analysis, Design, and Optimization of Spiral Inductors and Transformers for RF IC's," IEEE J. Solid-State Circuits, vol. 33, pp. 1470-1481, October, 1998).

Figure 13:
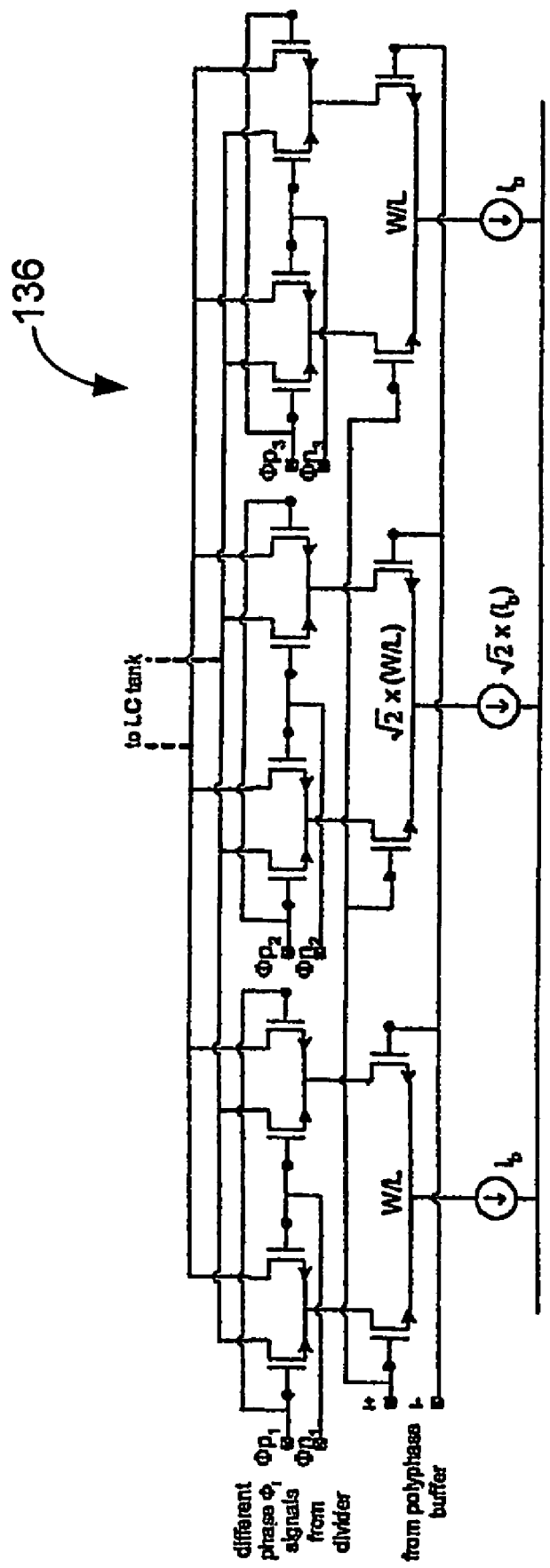
FIG. 13 presents a circuit diagram of harmonic-rejection mixer used in the exemplary CMOS down-converter of FIG. 11.

HRMs 136 were employed to relax the filtering requirements of the LC tanks 140, 142. The HRMs 136 reduce the mixer products generated by the 3rd and 5th harmonics of the divide-by-four circuit 138. The HRMs 136 are based on Gilbert-cell mixers as shown in FIG. 13. The phase delayed signals (φi) required by the HRMs 136 are provided by the divide-by-four circuit 138. The φi signals are weighted and delayed to achieve correct harmonic cancellation (see J. A. Weldon et. al., "A 1.75-GHz Highly Integrated Narrow-Band CMOS Transmitter with Harmonic-Rejection Mixers," IEEE J. Solid-State Circuits, vol. 36, pp. 2003-2015, December, 2001).

The inputs to the HRMs 136 are applied in quadrature to two sets of HRM pairs. This reduces various mixer products and also provides quadrature LO outputs.

The quadrature LO signals are then amplified by a pair of amplifiers 144, 146 and are applied to a pair of down-conversion mixers 148, 150. The oscillator signals are mixed with an RF signal received via the RF port 152, provide baseband in-phase and quadrature outputs at ports 154, 156.

Figure 14:
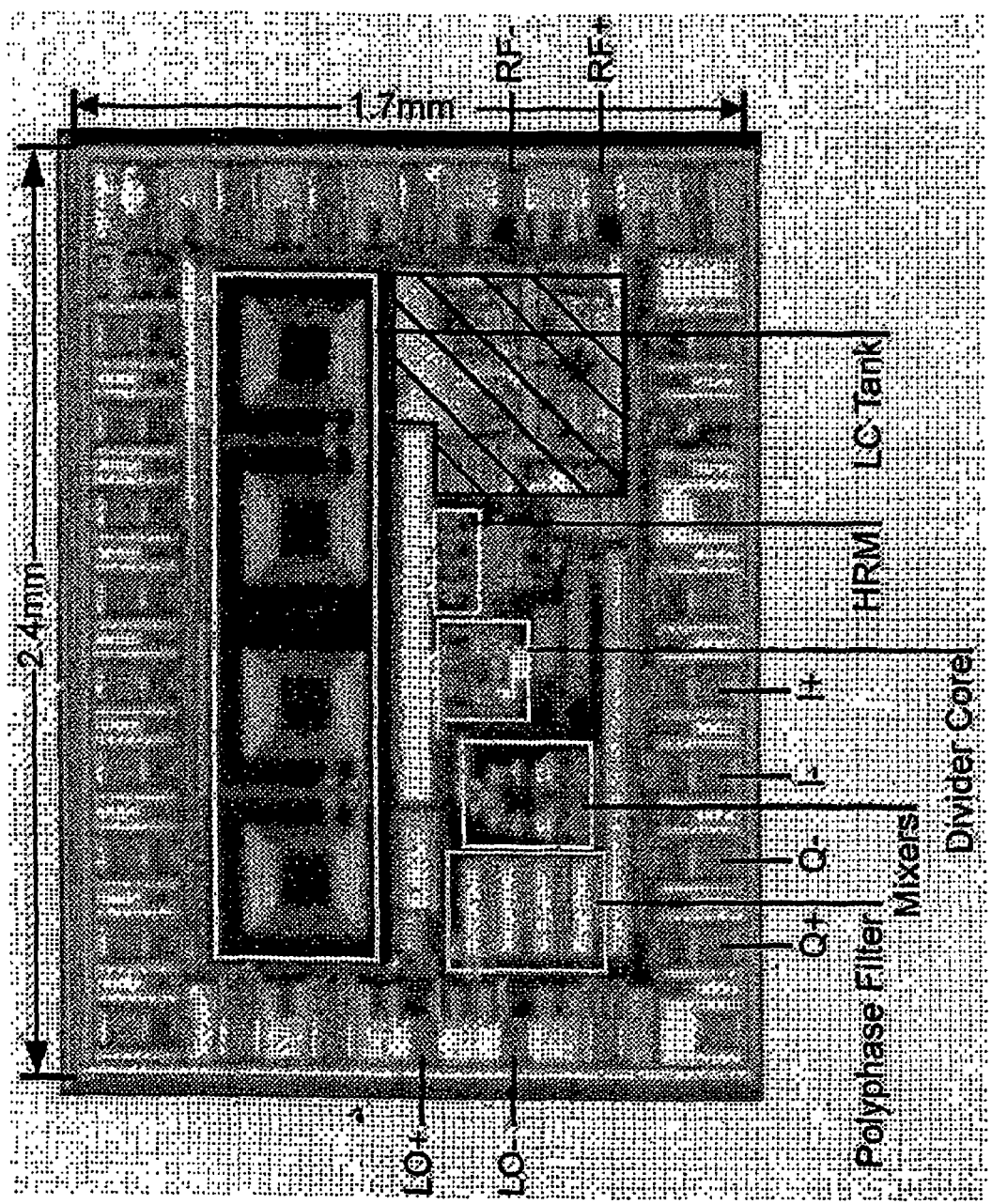
FIG. 14 presents a die photo of the exemplary CMOS down-converter of FIG. 11.

A die photo of the implemented system is shown in FIG. 14. The system, excluding the pad frame, occupies an area of approximately 1.5 mm$^2$.

Figure 15:
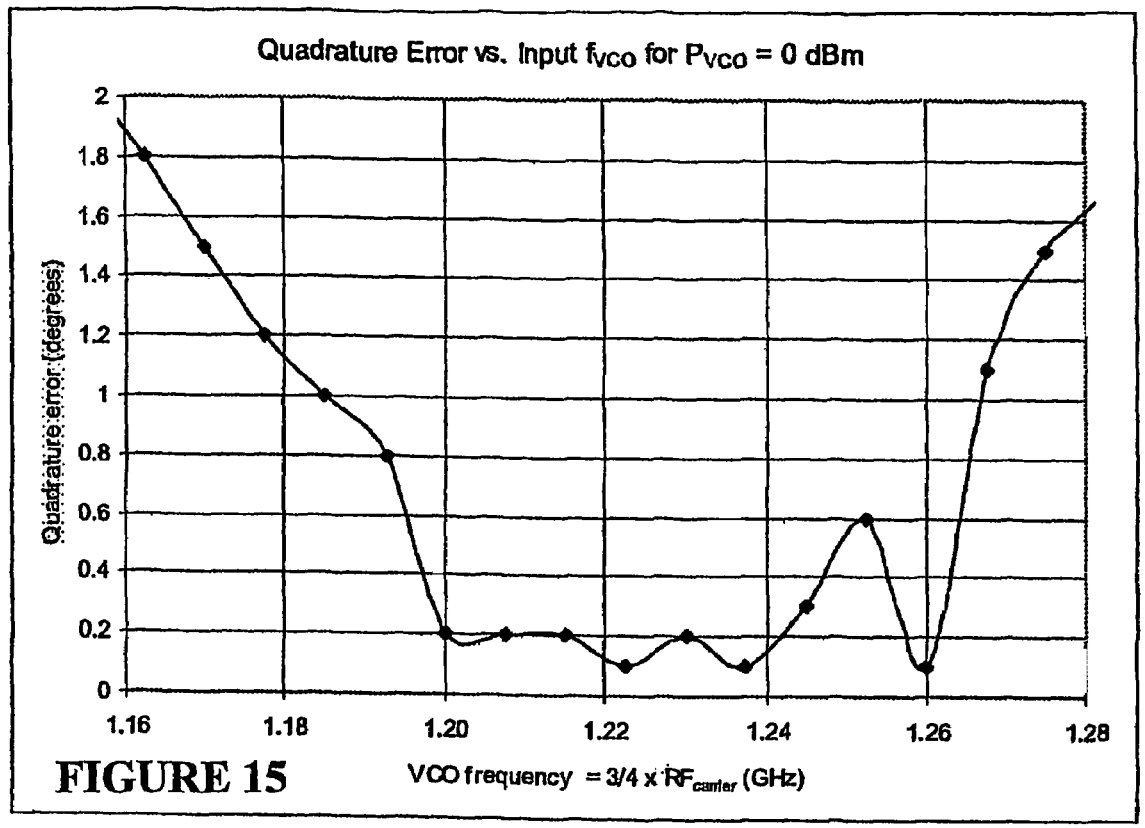
FIG. 15 presents a plot of quadrature error vs. input LO frequency for the exemplary CMOS down-converter of FIG. 11.

Across an input $f_{VCO}$ range of 1.16 to 1.28 GHz (equivalent to the down-conversion of an RF band between 1.55 to 1.70 GHz), the measured quadrature error (in degrees) vs. input $f_{VCO}$ for $P_{VCO}$=0 dBm, is shown in FIG. 15. All data is plotted versus the frequency that was applied to the fVCO port of the chip. Note that a quadrature error of less than 2° is achieved over the entire frequency range.

Figure 16:
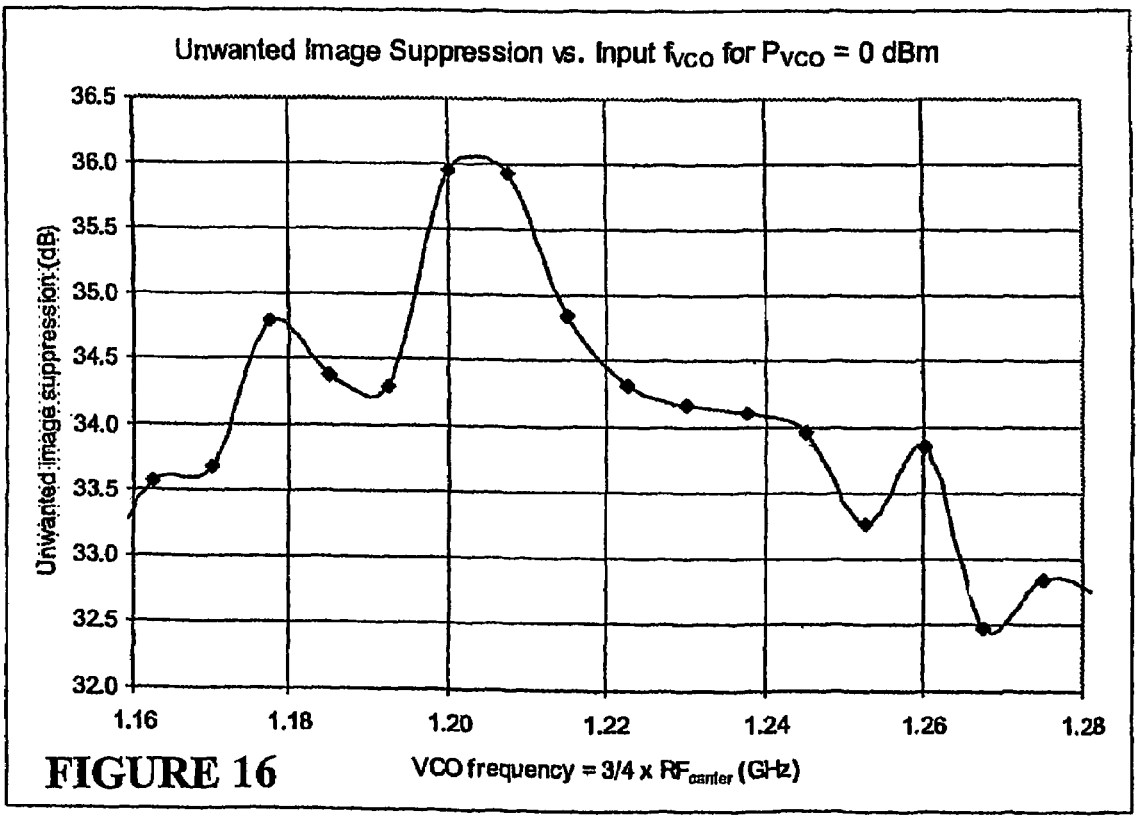
FIG. 16 presents a plot of calculated unwanted image suppression vs. input LO frequency for the exemplary CMOS down-converter of FIG. 11.

The equivalent unwanted image suppression of this down-conversion system has been calculated based on the measured phase and amplitude mismatch, and is presented in the graph of FIG. 16, Unwanted Image Suppression vs. Input $f_{VCO}$ for $P_{VCO}$=0 dBm.

As stated, the HRMs 136 are utilized to reduce the mixer products generated as a result of the 3rd and 5th harmonic outputs from the divide-by-four circuit. These are situated at 3/4×RFcarrier and 5/4×RFcarrier, and mix with the input LO, at 3/4×RFcarrier to generate unwanted products at the following fractions of the RFcarrier: 1/2, 3/2, and 2; these products were measured to be −36 dBc, −51 dBc, and −49 dBc, respectively.

A summary of measured results is as follows:

TABLE IV

Summary of Measured Results for CMOS Implementation

| | |
|---|---|
| Total power consumption at 1.8 V | 45 mW |
| Core LO circuit power consumption at 1.8 V | 27 mW |
| RF band | 1.55~1.70 Ghz |
| fVCO range required | 1.16~1.28 Ghz |
| Quadrature error (PVCO = 0 dBm) | <2° |
| Amplitude mismatch (PVCO = 0 dBm) | <0.37 dB |
| Equivalent Unwanted Image Suppression | >32 dB |
| LO-RF leakage (0 dBm applied at 1.23 GHz) | −86 dBm at 1.64 GHz at mixer inputs |
| RF-LO leakage (−10 dBm at 1.64 GHz) | −72 dBm |
| Harmonic rejection at: ½ × RFcarrier | −36 dBc |
| 3/2 × RFcarrier | −51 dBc |
| 2 × RFcarrier | −49 dBc |
| Circuit Area (excluding pad frame) | 1.5 mm² |
| Technology | 0.18 μm CMOS |

A VCO frequency of 3/4×RFcarrier, or 1.16 to 1.28 GHz, is needed, to operate in an RF band from 1.55 to 1.70 GHz and generate the required LO for direct conversion or low-IF architectures. A phase error of less than 2°, with greater than an equivalent 32 dB image suppression is achieved across this band. An LO-RF leakage of −86 dBm was measured at the mixer input ports.

While this example was done using direct conversion, the system could also be used in a low-IF architecture.

Advantages of the Invention

The invention provides many advantages over other down convertors known in the art. To begin with, it offers:
1. minimal 1/t noise;
2. minimal imaging problems;
3. minimal leakage of a local oscillator (LO) signal into the RF output band;
4. removes the necessity of having a second LO as required by super-heterodyne circuits, and various (often external) filters; and
5. has a higher level of integration as the components it does require are easily placed on an integrated circuit. For example, no large capacitors or sophisticated filters are required.

A high level of integration results in decreased IC (integrated circuit) pin counts, decreased signal power loss, decreased IC power requirements, improved SNR (signal to noise ratio), improved NF (noise factor), and decreased manufacturing costs and complexity.

The benefits of the invention are most apparent when it is implemented within a single-chip design, eliminating the extra cost of interconnecting semiconductor integrated circuit devices, reducing the physical space they require and reducing the overall power consumption. Increasing levels of integration have been the driving impetus towards lower cost, higher volume, higher reliability and lower power consumer electronics since the inception of the integrated circuit. This invention will enable communications devices to follow the same integration route that other consumer electronic products have benefited from.

Options and Alternatives

A number of variations can be made to the topology of the invention including the following:
1. the invention can be implement using bipolar technology, CMOS technology, BICMOS technology, or another semiconductor technology including, but not limited to Silicon/Germanium (SiGe), Germanium (Ge), Gallium Arsenide (GaAs), and Silicon on Sapphire (SOS);
2. the invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA); and
3. the mixers used in the topology of the invention could either be passive or active. Active mixers are distinct from passive mixers in a number of ways:
   a. they provide conversion gain. Thus, an active mixer can replace the combination of a low noise amplifier and a passive mixer;
   b. active mixers provide better isolation between the input and output ports because of the impedance of the active components; and
   c. active mixers allow a lower powered mixing signal to be used, reducing the noise that results when the mixing signal is generated.

CONCLUSIONS

While particular embodiments of the present invention have been shown and described, it is clear that changes and modifications may be made to such embodiments without departing from the true scope and spirit of the invention.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

What is claimed is:

1. A synthesizer circuit for generating complementary sin and cos oscillator signals from an input oscillator signal x(t), said complementary sin and cos oscillator signals being shifted in frequency from said input oscillator signal x(t), said synthesizer circuit comprising:
   a divider having an input and generating divided sin and cos outputs based on a signal received at said input;
   a first mixer for receiving said input oscillator signal x(t), and mixing said input oscillator signal x(t) with said sin output of said divider to generate an output signal;
   a second mixer for receiving said input oscillator signal x(t), and mixing said input oscillator signal x(t) with said cos output of said divider to generate an output signal;
   a first removal means for receiving said output signal of said first mixer and removing undesired frequency signals from said output signal, providing said frequency-shifted cos oscillator signal as an output; the frequency-shifted cos oscillator signal output of said first removal means also being connected to the input of said divider; and
   a second removal means for receiving said output signal of said second mixer and removing undesired frequency signals from said output signal, thus providing said frequency-shifted sin oscillator signal as an output.

2. The synthesizer circuit of claim 1, wherein said first and second removal means comprise first and second filters.

3. The circuit of claim 2 wherein said first and second filters comprise first and second high pass filters.

4. The circuit of claim 2 wherein said first and second filters comprise first and second notch filters.

5. The circuit of claim 1 wherein said divider comprises a divide-by-n divider.

6. The circuit of claim 5 wherein said divider comprises a divide-by-four divider.

7. The synthesizer circuit of claim 1, wherein said first and second removal means comprise first and second harmonic subtraction circuits.

8. The synthesizer circuit of claim 7, further comprising a polyphase filter for filtering said input signal x(t) prior to feeding said input signal x(t) into said first and second mixers.

9. The synthesizer circuit of claim 7, wherein each of said mixers comprises a harmonic rejection mixer.

10. A synthesizer circuit for generating complementary sin and cos oscillator signals from an input oscillator signal x(t), said complementary sin and cos oscillator signals being shifted in frequency from said input oscillator signal x(t), said synthesizer circuit comprising:
    a divider having an input and generating divided sin and cos outputs based on a signal received at said input;
    a first harmonic rejection mixer for receiving said input oscillator signal x(t), and mixing said input oscillator signal x(t) with said sin output of said divider to generate an output signal; a second harmonic rejection mixer for receiving said input oscillator signal x(t), and mixing said input oscillator signal x(t) with said cos output of said divider to generate an output signal;
    a first harmonic subtraction circuit for receiving said output signal of said first harmonic rejection mixer and removing undesired frequency signals from said output signal, providing said frequency-shifted cos oscillator signal as an output; the frequency-shifted cos oscillator signal output of said first removal means also being connected to the input of said divider; and
    a second harmonic subtraction circuit for receiving said output signal of said second harmonic rejection mixer and removing undesired frequency signals from said output signal, thus providing said frequency-shifted sin oscillator signal as an output.

* * * * *